United States Patent [19]
Saitou et al.

[11] Patent Number: 5,719,522
[45] Date of Patent: Feb. 17, 1998

[54] REFERENCE VOLTAGE GENERATING CIRCUIT HAVING REDUCED CURRENT CONSUMPTION WITH VARYING LOADS

[75] Inventors: Mitsuhiro Saitou, Oubu; Hajime Ito, Ichinomiya; Kiyoshi Yamamoto, Toyohashi; Hiroyuki Ban, Aichi-pref., all of Japan

[73] Assignee: Nippondenso Co., Ltd., Kariya, Japan

[21] Appl. No.: 814,935

[22] Filed: Mar. 12, 1997

Related U.S. Application Data

[63] Continuation of Ser. No. 547,587, Oct. 24, 1995, abandoned, which is a continuation of Ser. No. 164,811, Dec. 10, 1993, abandoned.

[30] Foreign Application Priority Data

Dec. 11, 1992 [JP] Japan .................. 4-331602

[51] Int. Cl.⁶ .................................................. G05F 1/10
[52] U.S. Cl. .................. 327/540; 327/538; 327/545; 323/315; 323/316
[58] Field of Search .................. 307/296.1, 296.3, 307/296.6, 296.8; 327/530, 538, 540, 541, 543, 545, 535; 323/313, 315, 316

[56] References Cited

U.S. PATENT DOCUMENTS

| | | | |
|---|---|---|---|
| 4,061,962 | 12/1977 | Stewart | 327/535 |
| 4,176,272 | 11/1979 | Powers | 327/108 |
| 4,342,926 | 8/1982 | Whately | 327/538 |
| 4,443,753 | 4/1984 | McGlinchey | 327/535 |
| 4,797,577 | 1/1989 | Hing | 307/296.6 |
| 5,109,187 | 4/1992 | Guliani | 327/535 |
| 5,148,049 | 9/1992 | Okutsu et al. | 327/111 |
| 5,157,285 | 10/1992 | Allen | 307/296.8 |
| 5,216,291 | 6/1993 | Seevinck et al. | 327/535 |
| 5,249,155 | 9/1993 | Arimoto et al. | 365/222 |
| 5,339,272 | 8/1994 | Tedrow et al. | 327/540 |
| 5,373,477 | 12/1994 | Sugibayashi | 327/541 |

FOREIGN PATENT DOCUMENTS 1-22643  4/1989  Japan .

*Primary Examiner*—Terry Cunningham
*Attorney, Agent, or Firm*—Cushman, Darby &Cushman IP Group of Pillsbury Madison & Sutro LLP

[57] ABSTRACT

A variable load current supply unit supplies a current to be consumed by a constant voltage output unit to a power source terminal thereof, and supplies a current to be consumed by a load circuit thereto through a reference voltage output terminal. The constant voltage output unit maintains a potential of the power source terminal thereof, i.e., a potential of the reference voltage output terminal, at a fixed potential. A base potential control unit negatively feeds back changes in the potential on the reference voltage output terminal to a base of an emitter follower transistor in the variable load current supply unit. In this way, when the current consumed by the load current is reduced and the potential on the reference voltage output terminal thereby slightly increases the current supplied by the variable load current supply unit decreases.

24 Claims, 4 Drawing Sheets

REFERENCE VOLTAGE GENERATING CIRCUIT HAVING REDUCED CURRENT CONSUMPTION WITH VARYING LOADS

This is a continuation of application Ser. No. 08/547,587, filed on Oct. 24, 1995, abandoned, which is a continuation of Ser. No. 08/164,811, filed Dec. 10, 1993, abandoned.

BACKGROUND OF THE INVENTION

1. Field of the Invention

The present invention relates to a reference voltage generating circuit.

2. Description of the Related Art

FIG. 6 illustrates a conventional reference voltage generating circuit. FIG. 5 is a block diagram of the conventional reference voltage generating circuit of FIG. 6. The reference voltage generating circuit includes a load resistor 91 to which a battery voltage VB is supplied from a battery (not shown). The load resistor 91 supplies a current i1 to be consumed to a power source terminal 92 of a constant voltage output unit 93. The power source terminal 92 of the constant voltage output unit 93 is connected to a reference voltage output terminal 95 which supplies a constant voltage Vc to a memory (not shown).

The above-described reference voltage generating circuit consumes a large amount of current, and thus there has been a demand for a reference voltage generating circuit which consumes less current. More specifically, in order to keep the potential of the reference voltage output terminal 95 at the constant voltage Vc, a current i flowing through the load resistor 91 must be maintained at (battery voltage VB—constant voltage Vc)/r91, where r91 is the resistance of the load resistor 91.

However, the current consumed in a load circuit may vary greatly. For example, in a memory, the current consumed may vary widely between the time when the memory is operating, i.e., a relatively high current draw, and the time when the memory is being backed-up, i.e., a relatively low current draw. For this reason, the current i1 consumed by the constant voltage output unit 93 must be increased when the load current decreases. Consequently, a large amount of current may be wasted while the load circuit is not in operation.

SUMMARY OF THE INVENTION

In view of the aforementioned problems of the prior art, an object of the present invention is to provide a reference voltage generating circuit which exhibits greatly reduced current consumption.

To achieve the above-described object, a preferred embodiment of the present invention provides a reference voltage generating circuit which comprises a constant voltage output unit having a power source terminal to which a current is supplied, the power source terminal being connected to a reference voltage terminal for outputting a reference voltage, a constant voltage being output to the power source terminal therefrom, a variable load current supply unit having an emitter follower transistor whose emitter is connected to the reference voltage output terminal to supply a current to the reference voltage output terminal, and a base potential control unit for negatively feeding back changes in a potential on the reference voltage output terminal to a base of the emitter follower transistor.

In a preferred embodiment of the present invention, a constant load current supply unit supplies a constant current to the reference voltage output terminal.

The variable load current supply unit supplies a current to be consumed by the constant voltage output unit to the power source terminal thereof, and supplies a current to be consumed by a load circuit thereto through the reference voltage output terminal. The constant voltage output unit maintains a potential on the power source terminal thereof, i.e., a potential on the reference voltage output terminal, at a fixed potential. The base potential control unit negatively feeds changes in the potential of the reference voltage output terminal back to a base of the emitter follower transistor. In this way, when the current consumed by the load circuit is reduced and the potential on the reference voltage output terminal thereby slightly increases, the base potential control unit reduces a base potential of the emitter follower transistor. Consequently, an emitter-base voltage of the emitter follower transistor decreases, and the current supplied by the variable load current supply unit decreases. Further, when the current consumed by the load circuit is increased and the potential on the reference voltage output terminal thereby is slightly reduced, the current supplied by the variable load current supply unit increases in compensation.

In the reference voltage generating circuit according to a preferred embodiment of the present invention, the base potential control unit applies, to the base of the emitter follower transistor for supplying a current to the reference voltage output terminal, a base control voltage which changes in a direction inverse to a direction in which the potential on the reference voltage output terminal changes. Thus, it is possible to reduce the current consumed by the reference voltage generating circuit in conjunction with a reduction in the current consumed by the load circuit, and a reference voltage generating circuit which consumes far less power than a conventional one can thus be provided.

DETAILED DESCRIPTION OF THE PREFERRED EMBODIMENTS

Figure 1:
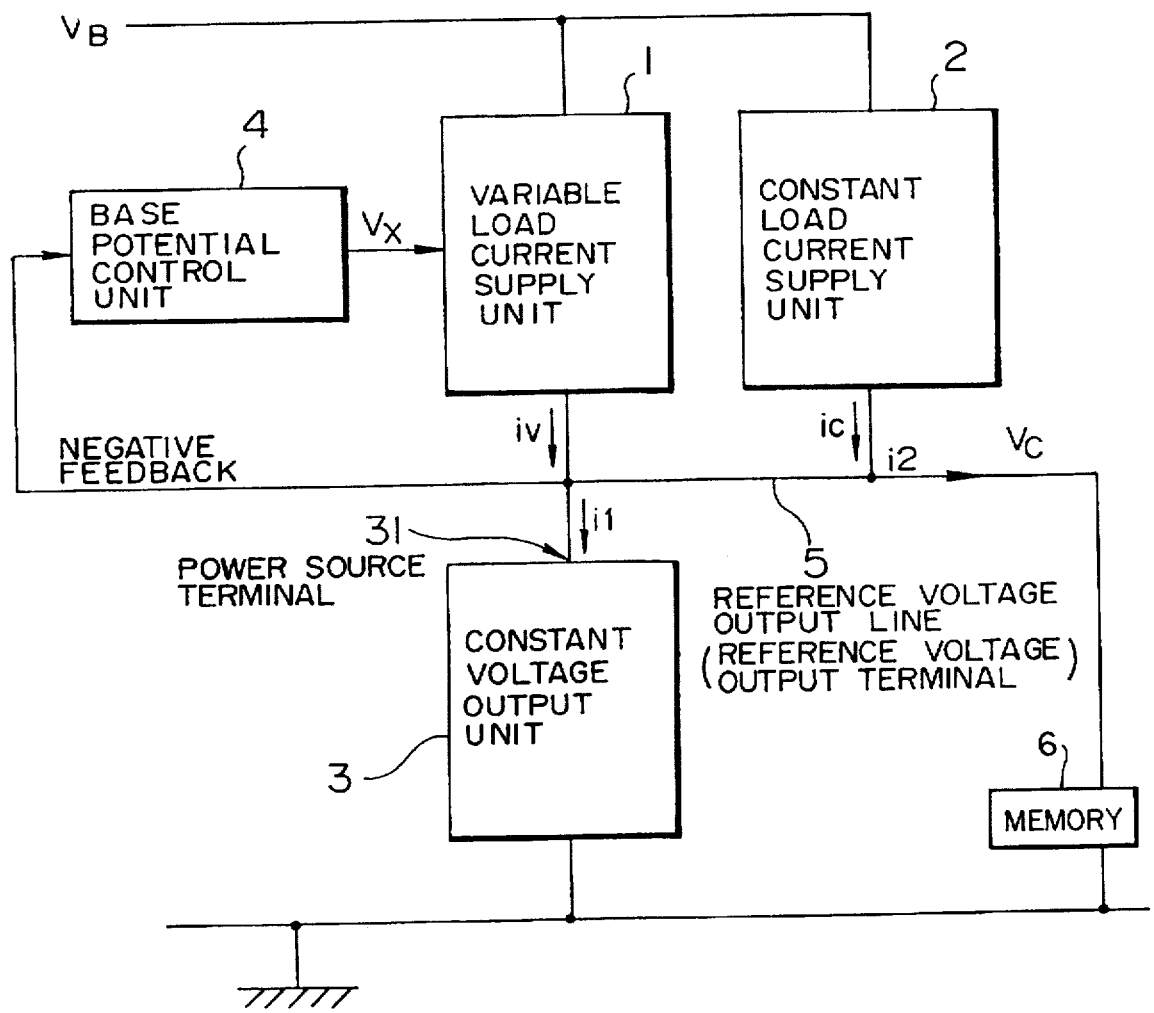
FIG. 1 is a circuit diagram showing an embodiment of a reference voltage generating circuit according to the present invention.
Figure 2:
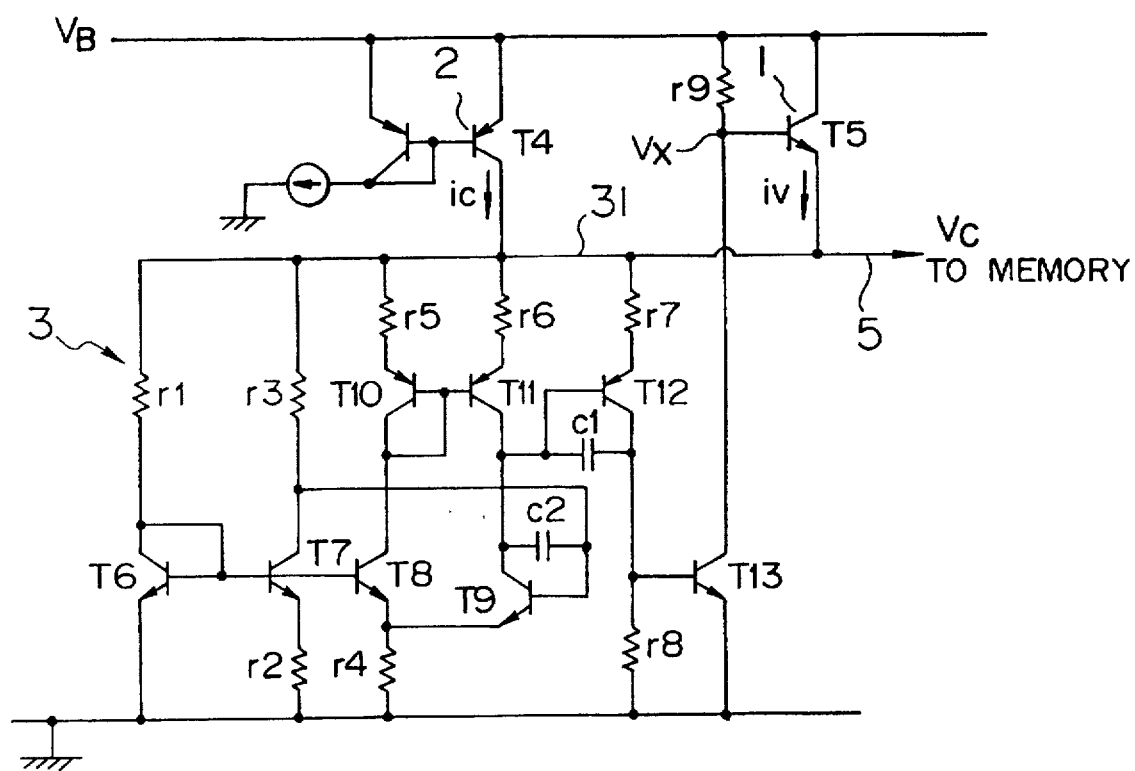
FIG. 2 is a circuit diagram showing an equivalent circuit of the embodiment shown in FIG. 1.

A first embodiment of a reference voltage generating circuit according to the present invention will be described below with reference to FIGS. 1 and 2.

The reference voltage generating circuit includes a variable load current supply unit 1 and a constant load current supply unit 2 to both of which a battery voltage VB is supplied from a battery (not shown). The variable load current supply unit 1 supplies a variable current iv to a reference voltage output terminal 5. The constant load current supply unit 2 supplies a constant current ic to the reference voltage output terminal 5.

A power source terminal 31 of a constant voltage output unit 3 is connected to both the reference voltage output line (reference voltage output terminal) 5 and a base potential control unit 4. The reference voltage output terminal 5 supplies a constant voltage Vc to, for example, a memory 6. An output terminal of the base potential control unit 4 applies a base potential to an emitter follower transistor T5 (see FIG. 2) of the variable load current supply unit 1. An emitter of the emitter follower transistor T5 supplies the current iv to the reference voltage output terminal. The base potential control unit 4 acts as an inverter for negatively feeding changes in the potential at the reference voltage output terminal 5 to a base of the emitter follower transistor T5 back.

The operation of the above-described reference voltage generating circuit will now be described.

In the following description, the current consumed by the base potential control unit 4 is ignored to simplify the description.

The sum of the variable load current iv supplied by the variable load current supply unit 1 and the constant load current ic supplied by the constant load current supply unit 2 is equal to the sum of a current i1 consumed (absorbed) by the constant voltage output unit 3 and a current i2 consumed by the memory 6.

When the current i2 of the memory is rapidly reduced, the potential on the reference voltage output terminal 5 increases slightly. Accordingly, the control voltage Vx that the base potential control unit 4 applies to the base of the emitter follower transistor T5 slightly decreases, and the emitter current of the emitter follower transistor T5 thereby decreases because the emitter-base voltage, Vbe=Vx−Vc, decreases. Consequently, the potential of the reference voltage output terminal 5 slightly decreases against the slight increase in the potential of the reference voltage output terminal 5, and the constant voltage output unit 3 can thereby maintain the potential on the reference voltage terminal 5 to at the constant voltage Vc without the consumed current i1 being substantially increased. In other words, in the reference voltage generating circuit of this embodiment, since the current supplied to the reference voltage output terminal 5 is reduced according to a reduction in the current consumed by the load circuit 6, a reduction in the circuit's current consumption is possible.

Another feature of this embodiment is that a current is supplied to the load circuit 6 by both the variable load current supply unit 1 and the constant load current supply unit 2, which may be a current mirror circuit.

This structure has the following advantages.

As mentioned above, the current which flows out from the reference voltage output terminal 5 is the sum of the current i1 consumed (absorbed) by the constant voltage output unit 3 and the current i2 consumed by the memory 6. Herein, i2 greatly varies depending on the operating state of the memory 6. It is desirable that the constant voltage output unit 3 be used in such a manner that the consumed current i1 does not change greatly, i.e, that it remains at a substantially constant current level. In that case, variations in the constant voltage Vc output to the output terminal 31 are small. In other words, the most desirable operation is that which ensures that the entire consumed current is equal to the sum of the substantially constant consumed current i1 and the variable consumed current i2.

If the entire consumed current is equal to the sum of the constant consumed current i1 and the variable consumed current i2 supplied by the variable load current supply unit 1 alone, since the emitter current of the emitter follower transistor T5 and the emitter-base voltage, Vbe (=Vx−Vc), have an exponential form, a reduction rate of the emitter current supplied when the potential of the reference voltage output terminal 5 excessively increases for various reasons is great. Consequently, the emitter current iv rapidly and transiently decreases to the consumed current i1 or below, and the transient reduction in the potential of the reference voltage output terminal 5 consequently is too great. Further, at the initial stage of the application of the battery voltage VB to the reference voltage generating circuit or when the voltage is mixed with noise, it takes time for the constant voltage Vc of the reference voltage output terminal 5 to be stabilized.

In this embodiment, while the memory 6 is backed up, the constant load current supply unit 2 supplies most of the consumed currents i1 and i2, while the emitter follower transistor T5 of the variable load current supply unit 1 supplies only a small amount of the consumed current i2. During the operation of the memory 6, most of the increase in the consumed current i2 resulting from the memory's operation is supplied from the emitter follower transistor T5 of the variable load current supply unit 1. Part of the increase in the consumed current i2 is covered by a reduction in the current consumed by the constant voltage output unit 3.

Thus, since the reference voltage generating circuit includes the constant load current supply unit 2, the emitter follower transistor T5 of the variable load current supply unit 1 can be used within a smaller emitter current range (a range in which the emitter-base voltage Vbe is small and in which changes in the emitter current relative to changes in the emitter-base voltage Vbe are small) than that which is obtained when no constant load current supply unit 2 is provided. Thus, changes in the emitter current relative to slight changes in the potential of the reference voltage output terminal 5 (e.g., a reference voltage containing various types of noise signals voltage) can be made less sensitive, and fluctuation of the potential of the reference voltage output terminal 5 which would otherwise last for a long time when the power is turned on can thus be prevented.

An implementation of the circuit shown in FIG. 1 will be described below with reference to FIG. 2.

Transistors T6 and T7 and the resistors r1, r2 and r3 constitute the constant voltage generating stage of the constant voltage output unit 3. The transistor T6 whose collector is connected to a base thereof and whose emitter is grounded is regarded as a diode. The base potential of the transistor T6 is regarded as a substantially constant voltage, even though it slightly fluctuates due to fluctuation of the constant voltage Vc (all constant voltages Vc hereinafter referred to are the potential on the reference voltage output terminal 5).

In the transistor T7, a fixed collector current, defined by the above-described fixed base potential and a predetermined emitter resistor r2, flows. The voltage of this collector current drops across the resistor r3 by a predetermined value. As a result, the collector potential of the transistor T7 is also regarded as fixed. When the constant voltage Vc increases, the base potential of the transistor T7 slightly increases, thus reducing the collector potential thereof. However, the increase in the constant voltage Vc increases the collector potential of the transistor T7 through the resistor r3 by a degree greater than the degree with which the collector potential is reduced due to the increase in the base potential. As a result, an increase in the constant voltage Vc slightly increases the collector potential of the transistor T7. In the transistor T7, the base potential and the collector potential are set to substantially the same potential.

Transistors T8 through T12 and resistors r4 through r8 constitute the output amplifying stage of the constant voltage output unit 3. The base potential of the transistors T6 and T7 is applied to the transistor T8. The collector potential of the transistor T7 is applied to the base of the transistor T9.

When the collector potential of the transistor 7 slightly increases by an increase in the constant voltage Vc and the base potential of the transistor T9 thereby increases, the emitter current and collector current of the transistor T9 increase, thus increasing the emitter potential of the transistor T9 and reducing the collector potential thereof. When the emitter potential of the transistor T9 is increased, the emitter potential of the transistor T8 increases, thus reducing the collector current thereof. Accordingly, the collector potential of the transistor T10 increases, and the base potential of the transistor T11 thus increases. Consequently, although the emitter potential of the transistor T11 is increased by an increase in the constant voltage Vc through the resistor r6, an increase in the base potential of the transistor T11 reduces the collector current of the transistor T11.

Thus, an increase in the constant voltage Vc reduces the collector current of the transistor T11, increasing the collector current of the transistor T9. Accordingly, the collector potentials of the transistors T9 and T11 are reduced, the base potential of the transistor T12 is reduced, the collector current thereof is increased, the base potential of a transistor T13 is increased, the collector current thereof is increased, the base potential of the transistor T5 is reduced, and the emitter current iv supplied from the emitter follower transistor T5 to the reference voltage output terminal 5 is thereby reduced.

In other words, when the potential on the reference voltage output terminal 5 slightly increases due to a reduction in the power consumed by the memory, the current supplied by the emitter follower transistor T5 decreases, and an increase in the potential on the reference voltage output terminal 5 is thus prevented. C1 and C2 denote phase compensating capacitors.

An inverter composed of the transistor T13 and a load resistor r9 constitutes the base potential control unit according to a first embodiment of the present invention. The emitter follower transistor T5 constitutes the variable load current supply unit 1, and the transistor T4 constitutes the constant load current supply unit 2.

When the potential on the reference voltage output terminal 5 slightly decreases due to an increase in the current consumed by the memory 6, the current supplied from the emitter follower transistor T5 increases, and a reduction in the potential on the reference voltage output terminal is thus prevented.

In this embodiment, the common-emitter PNP transistor T4 having the base to which a fixed voltage is applied supplies the fixed current ic to the reference voltage output terminal 5. In this embodiment, the fixed current ic covers most of the current consumed by the constant voltage output unit 3 and the current required to back up the memory. Therefore, the emitter follower transistor T5 can be used within a small emitter-base voltage range, and the stability of the entire circuit can be improved.

Figure 3:
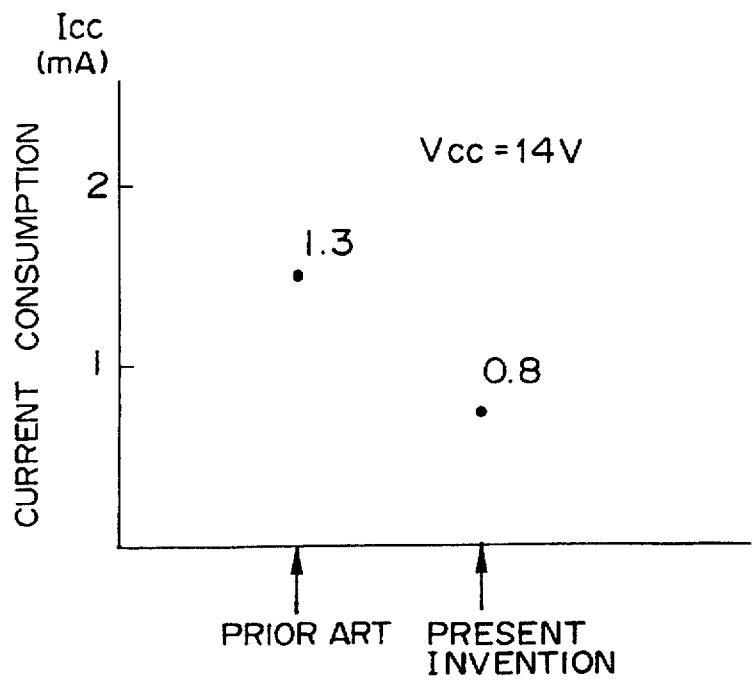
FIG. 3 is a graph showing the results of a comparison between a current consumption of the embodiment of FIG. 1 and that of a conventional circuit.
Figure 6:
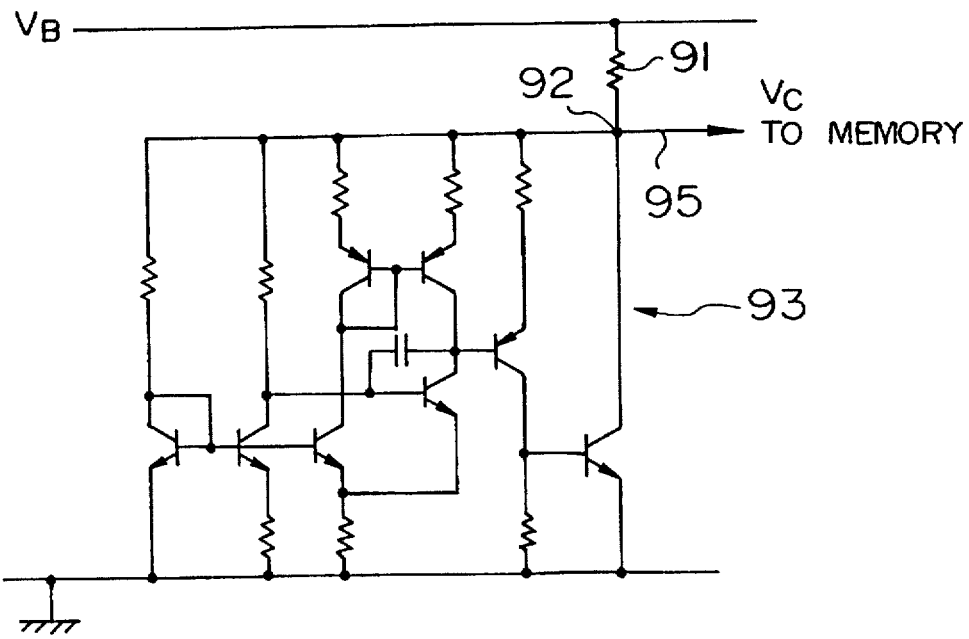
FIG. 6 is a circuit showing an equivalent circuit of the example shown in FIG. 5.

FIG. 3 is a graphic representation of the current consumption of the circuit according to the first embodiment (FIG. 2) and that of a conventional circuit (FIG. 6) when Vc is 14 volts.

Figure 4:
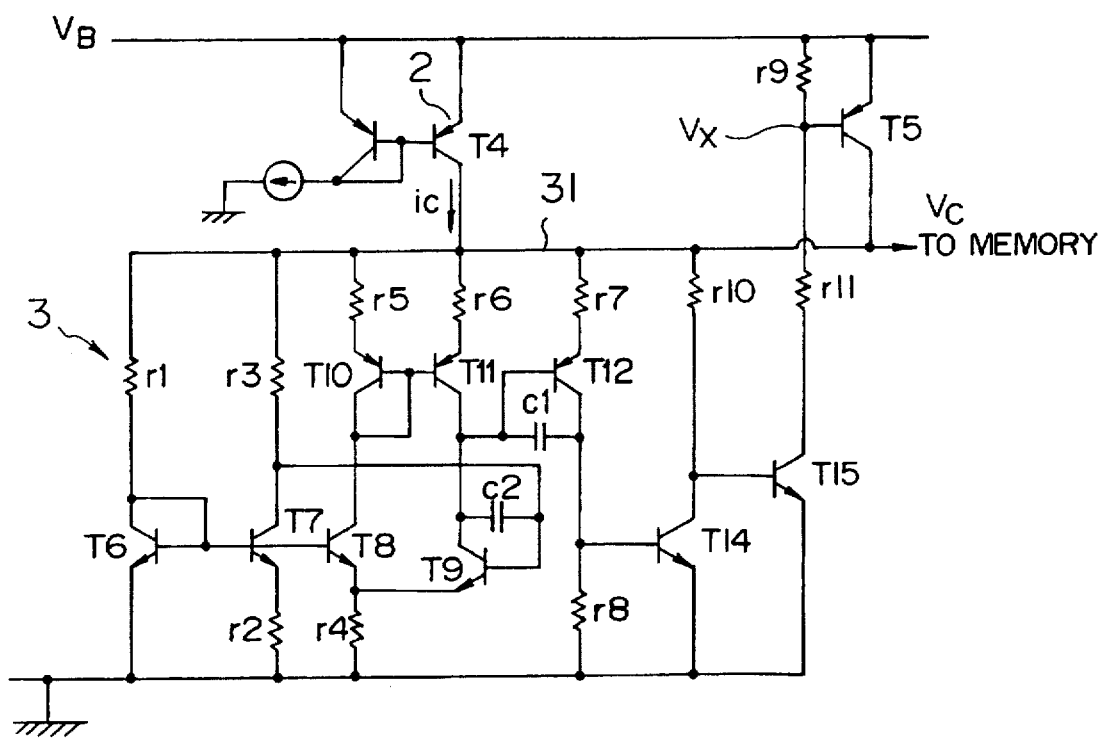
FIG. 4 shows a modification of the embodiment shown in FIG. 2.
Figure 5:
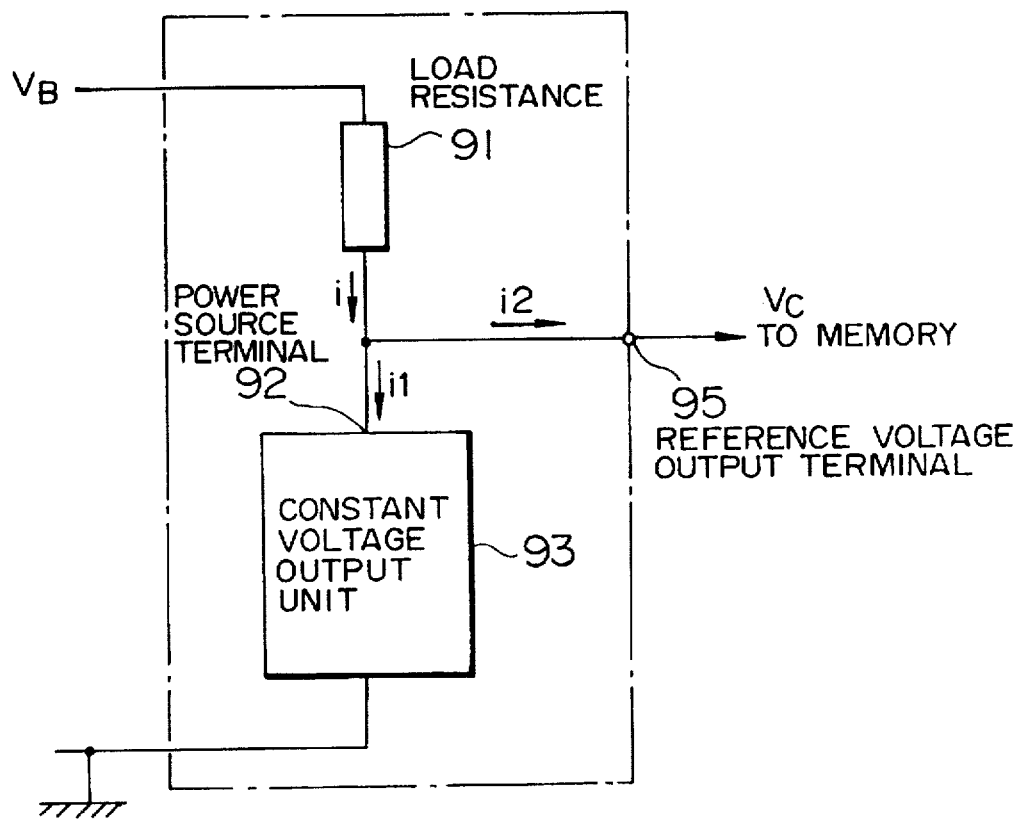
FIG. 5 is a circuit diagram showing an example of a conventional reference voltage generating circuit.

In a second embodiment shown in FIG. 4, the transistor T5 is not used in an emitter follower configuration but in common-emitter configuration which includes transistors T14 and T15 and resistors r10 and r12.

What is claimed is:

1. A reference voltage generating circuit comprising:
    a constant voltage output unit having a power source terminal to which current is supplied, said power source terminal being connected to a reference voltage output terminal for outputting a reference voltage, a constant voltage being output to said power source terminal therefrom;
    a constant load current supply unit for supplying a constant current to said reference voltage output terminal independently of fluctuations of a potential on said reference voltage output terminal;
    a variable load current supply unit for supplying a variable current to said reference voltage output terminal responsive to a potential control signal; and
    a potential control unit for negatively feeding back a potential on said reference voltage output terminal only to said variable load current supply unit as said potential control signal.

2. A reference voltage generating circuit according to claim 1, wherein said variable load current supply unit has an emitter follower transistor whose emitter is connected to said reference voltage output terminal.

3. A reference voltage generating circuit according to claim 2, wherein said potential control unit negatively feeds back changes in a potential of said reference voltage output terminal to a base of said emitter follower transistor.

4. A reference voltage generating circuit according to claim 1, said constant load current supply unit comprising a first constant current supply transistor whose collector is connected to said reference voltage output terminal in order to supply said constant current to said reference voltage output terminal via said collector.

5. A reference voltage generating circuit comprising:
    a constant voltage output unit having a power source terminal to which current is supplied, said power source terminal being connected to a reference voltage terminal for outputting a reference voltage, a constant voltage being output to said power source terminal therefrom;
    a constant load current supply unit for supplying a constant current to said reference voltage output terminal independently of fluctuations of a potential on said reference voltage output terminal, said constant load current supply unit including a first constant current supply transistor whose collector is connected to said reference voltage output terminal in order to supply said constant current to said reference voltage output terminal via said collector;
    a variable load current supply unit for supplying a variable current to said reference voltage output terminal responsive to a potential control signal; and
    a potential control unit for negatively feeding back a potential on said reference voltage output terminal to said variable load current supply unit as said potential control signal;
    wherein said constant current load supply unit includes a second constant current supply transistor having a grounded collector and its base and emitter connected to a base of said first constant current supply transistor, and
    a base potential of said first constant current supply transistor is the same as a base potential of said second constant current supply transistor.

6. A reference voltage generating circuit according to claim 5, wherein:

said constant load current supply unit is for supplying a constant current to said reference voltage output terminal independently of fluctuations of a potential on said reference voltage output terminal; and said potential control unit is for negatively feeding back said potential of said load circuit only to said variable load current supply unit.

7. A reference voltage generating circuit according to claim 1, wherein said constant load current supply unit comprises a transistor whose collector is connected to said reference voltage output terminal.

8. A reference voltage generating circuit comprising:

a constant voltage output unit having a power source terminal to which current is supplied, said power source terminal being connected to a reference voltage output terminal for outputting a reference voltage, a constant voltage being output to said power source terminal therefrom;

a constant load current supply unit, having an output connected to said reference voltage output terminal, for providing a constant load current independent of fluctuations of a potential on said reference voltage output terminal;

a variable load current supply unit for supplying a current to said reference voltage output terminal;

a load circuit parallel-connected to said constant voltage output unit, a current being supplied from said reference voltage output terminal thereto; and a potential control unit for negatively feeding back a potential of said load circuit only to said variable load current supply unit.

9. A reference voltage generating circuit according to claim 8, wherein said potential control unit comprises an inverter, said potential control signal being present at a series connection between a load resistor and a transistor in said inverter.

10. A reference voltage generating circuit according to claim 8, wherein said load circuit is a memory circuit.

11. A reference voltage generating circuit according to claim 10, wherein said memory circuit has at least an operational state and a backup state.

12. A reference voltage generating circuit according to claim 8, wherein said variable load current supply unit has an emitter follower transistor whose emitter is connected to said reference voltage terminal.

13. A reference voltage generating circuit according to claim 12, wherein said potential control unit negatively feeds back a potential of said reference voltage terminal to a base of said emitter follower transistor.

14. A reference voltage generating circuit according to claim 8, said constant load constant current supply unit comprising a constant current supply transistor whose collector is connected to said reference voltage output terminal.

15. A reference voltage generating circuit according to claim 8, wherein said constant load current supply unit comprises a transistor whose collector is connected to said reference voltage output terminal.

16. A reference voltage generating circuit according to claim 8, wherein:

said variable load current supply unit has an emitter follower transistor whose emitter is connected to said reference voltage output terminal;

said potential control unit includes a feedback transistor which negatively feeds back a potential of said reference voltage output terminal to a base of said emitter follower transistor via the collector of the feedback transistor; and the potential control unit further includes a load resistor connected between a collector and base of said emitter follower transistor.

17. A reference voltage generating circuit according to claim 8, wherein:

said variable load current supply unit has a common emitter transistor whose collector is connected to said reference voltage output terminal;

said potential control unit includes a feedback transistor which negatively feeds back a potential of said reference voltage output terminal to a base of said common emitter transistor via the collector of the feedback transistor; and the potential control unit further includes a load resistor connected between an emitter and a base of said common emitter transistor.

18. A reference voltage generating circuit according to claim 8, wherein most of the current supplied to said reference voltage output terminal is from said constant load current supply unit, and a remainder is from said variable load current supply unit.

19. A reference voltage generating circuit according to claim 18, wherein:

said variable load current supply unit includes a bipolar transistor, said current supplied to said reference voltage output terminal by said variable load current supply unit being determined by an exponential characteristic of a base-emitter voltage of said bipolar transistor.

20. A reference voltage generating circuit comprising:

a constant voltage output unit having a power source terminal to which current is supplied, said power source terminal being connected to a reference voltage terminal for outputting a reference voltage, a constant voltage being output to said power source terminal therefrom;

a constant load current supply unit having an output connected to said reference voltage output terminal;

a variable load current supply unit for supplying a variable current to said reference voltage output terminal responsive to a potential control signal; and a potential control unit for negatively feeding back a potential on said reference voltage output terminal to said variable load current supply unit as said potential control signal;

wherein said potential control unit comprises two transistors having a common emitter connection and two resistors connected in series with one of said transistors, said potential control signal being present at a series connection between said two resistors.

21. A reference voltage generating circuit comprising:

a constant voltage output unit having a power source terminal to which current is supplied, said power source terminal being connected to a reference voltage terminal for outputting a reference voltage, a constant voltage being output to said power source terminal therefrom;

a constant load current supply unit having an output connected to said reference voltage output terminal;

a variable load current supply unit for supplying a variable current to said reference voltage output terminal responsive to a potential control signal; and a potential control unit for negatively feeding back a potential on said reference voltage output terminal to said variable load current supply unit as said potential control signal;

wherein said variable load current supply unit has an emitter follower transistor whose emitter is connected to said reference voltage output terminal;

said potential control unit includes a feedback transistor which negatively feeds back a potential of said reference voltage output terminal to a base of said emitter follower transistor via the collector of the feedback transistor; and the potential control unit further includes a load resistor connected between a collector and base of said emitter follower transistor.

22. A reference voltage generating circuit comprising:

a constant voltage output unit having a power source terminal to which current is supplied, said power source terminal being connected to a reference voltage output terminal for outputting a reference voltage, a constant voltage being output to said power source terminal therefrom;

a constant load current supply unit for supplying a constant current to said reference voltage output terminal independently of fluctuations of a potential on said reference voltage output terminal;

a variable load current supply unit for supplying a variable current to said reference voltage output terminal responsive to a potential control signal; and a potential control unit for negatively feeding back a potential on said reference voltage output terminal to said variable load current supply unit as said potential control signal by detecting variations in said constant voltage from said constant voltage output unit.

23. A reference voltage generating circuit according to claim 22, wherein:

said potential control unit comprises a potential sensing unit for detecting variations in said constant voltage from said constant voltage output unit and generating a signal corresponding thereto; and said potential control unit is for negatively feeding back said potential on said reference voltage output terminal responsive to said signal from said potential sensing unit.

24. A reference voltage generating circuit according to claim 23, further comprising a phase compensating capacitance for providing said signal from said potential sensing unit to a remainder of said potential control unit.

* * * * *